United States Patent
Kang et al.

(10) Patent No.: US 10,559,726 B2
(45) Date of Patent: Feb. 11, 2020

(54) LAYERED STRUCTURES AND QUANTUM DOT SHEETS AND ELECTRONIC DEVICES INCLUDING THE SAME

(71) Applicant: SAMSUNG ELECTRONICS CO., LTD., Suwon-si, Gyeonggi-do (KR)

(72) Inventors: Hyun A Kang, Suwon-si (KR); Nayoun Won, Suwon-si (KR); Eun Joo Jang, Suwon-si (KR); Ha Il Kwon, Suwon-si (KR); Jeong Hee Lee, Seongnam-si (KR); Oul Cho, Suwon-si (KR); Tomoyuki Kikuchi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 27 days.

(21) Appl. No.: 15/581,861

(22) Filed: Apr. 28, 2017

(65) Prior Publication Data
US 2017/0317246 A1 Nov. 2, 2017

(30) Foreign Application Priority Data
Apr. 28, 2016 (KR) .................. 10-2016-0052520

(51) Int. Cl.
| | | |
|---|---|---|
| C09K 11/02 | (2006.01) | |
| H01L 33/50 | (2010.01) | |
| C08G 75/045 | (2016.01) | |
| C08K 3/34 | (2006.01) | |
| C08K 3/36 | (2006.01) | |
| G02F 1/13357 | (2006.01) | |
| G02F 1/1335 | (2006.01) | |

(52) U.S. Cl.
CPC .......... *H01L 33/505* (2013.01); *C08G 75/045* (2013.01); *C08K 3/346* (2013.01); *C08K 3/36* (2013.01); *H01L 33/502* (2013.01); *G02F 1/1336* (2013.01); *G02F 2001/133614* (2013.01); *G02F 2202/36* (2013.01)

(58) Field of Classification Search
CPC ..... H01L 51/5012; B32B 27/00; C09K 11/02; C08G 75/045
See application file for complete search history.

(56) References Cited

U.S. PATENT DOCUMENTS

| | | |
|---|---|---|
| 8,823,154 B2 | 9/2014 | Hawker et al. |
| 10,053,556 B2 * | 8/2018 | Kikuchi .................. C08F 2/38 |

| | | |
|---|---|---|
| 2012/0001217 A1 | 1/2012 | Kang et al. |
| 2015/0300600 A1 | 10/2015 | Dubrow et al. |
| 2016/0005932 A1 | 1/2016 | Lee et al. |
| 2016/0160060 A1 | 6/2016 | Kikuchi et al. |
| 2016/0264820 A1 | 9/2016 | Kikuchi et al. |

FOREIGN PATENT DOCUMENTS

| | | |
|---|---|---|
| EP | 2622002 A1 | 4/2012 |
| JP | 2010-228412 A | 10/2010 |
| JP | 2011-218586 A | 11/2011 |
| JP | 5294594 B2 | 6/2013 |
| KR | 2016-0068560 A | 6/2016 |
| KR | 2016-0109497 A | 9/2016 |

OTHER PUBLICATIONS

Extended European Search Report dated Sep. 12, 2017, issued for the corresponding European Patent Application No. 17168408.7.
Amber E. Rydholm et al. "Development and characterization of degradable thiol-allyl ether photopolymers", Polymer 48 (2007) 4589-4600.
Amber E. Rydholm et al. "Effects of neighboring sulfides and pH on ester hydrolysis in thiol-acrylate photopolymers", Acta Biomaterialia 3 (2007) 449-455.

\* cited by examiner

*Primary Examiner* — Gregory Listvoyb
(74) *Attorney, Agent, or Firm* — Cantor Colburn LLP

(57) ABSTRACT

A layered structure having a first layer including a polymerization product of a monomer combination including a first monomer having at least two thiol groups at its terminal end and a second monomer having at least two carbon-carbon unsaturated bond-containing groups at its terminal end, wherein the first monomer includes a first thiol compound represented by Chemical Formula 1-1 including a thioglycolate moiety and a second thiol represented by Chemical Formula 1-2, and wherein the second monomer includes an ene compound represented by Chemical Formula 2:

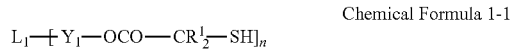

Chemical Formula 1-1

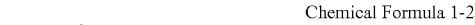

Chemical Formula 1-2

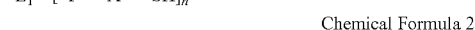

Chemical Formula 2 wherein in Chemical Formulae 1-1, 1-2, and 2, groups and variables are the same as described in the specification.

6 Claims, 13 Drawing Sheets

LAYERED STRUCTURES AND QUANTUM DOT SHEETS AND ELECTRONIC DEVICES INCLUDING THE SAME

CROSS-REFERENCE TO RELATED APPLICATION

This application claims priority to and the benefit of Korean Patent Application No. 10-2016-0052520 filed in the Korean Intellectual Property Office on Apr. 28, 2016, and all the benefits accruing therefrom under 35 U.S.C. § 119, the contents of which is incorporated herein in its entirety by reference.

BACKGROUND

1. Field

Layered structure and a quantum dot sheet, and an electronic device including the same are disclosed.

2. Description of the Related Art

A light emitting particle may be dispersed in a polymer host matrix and may be used in various display devices as a composite. For example, a semiconductor nanocrystal called a quantum dot (QD) may be dispersed in a host matrix of a polymer or an inorganic material, and thus, may be used as a light conversion layer in a light emitting diode (LED) and the like. Particle size of the quantum dots may be relatively readily adjusted during colloid synthesis, and in addition, the particle sizes may be uniformly controlled. When the quantum dot has a size of less than or equal to about 10 nanometers (nm), a quantum confinement effect becomes significant, and thus, as the particle size decreases, the bandgap increases, and thereby the energy density becomes larger. Accordingly, the quantum dot may emit light in a visible light region with excellent luminous efficiency. Active research efforts have been focused on application of the quantum dot to various lighting devices, a light emitting diode (LED) for a backlight unit, and the like.

The quantum dot has theoretical quantum efficiency of about 100% and may emit light with a higher color purity (e.g., of less than or equal to about 40 nm of a full width at half maximum (FWHM)). Thus, the quantum dot is expected to provide high luminous efficiency and improved color reproducibility compared to an inorganic phosphor used in a conventional art. Unlike the micro-sized inorganic phosphor, the nano-sized quantum dot has a short life as the nano-sized quantum dot is vulnerable, for example, to an external factor such as moisture or oxygen, and therefore, there remains a need to develop a technology for overcoming such drawbacks. When the quantum dot is used in the form of a quantum dot-polymer composite in a light emitting diode or as a quantum dot sheet, it is important to maintain a passivation layer on the surface of the quantum dot in order to secure its high efficiency and color purity. The quantum dot-polymer composite may have a barrier film for protecting the quantum dot from moisture or oxygen. Currently, a deposited metal oxide (e.g., formed by sputtering and the like) has been used for a barrier film. However, a currently available barrier coating is economically and technologically inferior, and shows a greatly reduced performance under a harsh condition (e.g., at a high temperature with a high humidity).

SUMMARY

An embodiment provides a layered structure that is applicable to a photoconversion layer including a quantum dot as a barrier element.

Another embodiment provides a quantum dot sheet including the layered structure.

Yet another embodiment provides a backlight unit and an electronic device including the quantum dot sheet.

In an embodiment, a layered structure includes a first layer including a polymerization product of a monomer combination including a first monomer having at least two thiol groups at its terminal end and a second monomer having at least two carbon-carbon unsaturated bond-containing groups at its terminal end, wherein the first monomer includes a first thiol compound represented by Chemical Formula 1-1 including a thioglycolate moiety and a second thiol represented by Chemical Formula 1-2:

Chemical Formula 1-1 wherein in Chemical Formula 1-1, $L_1$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond or a substituted or unsubstituted C1 to C4 alkylene group, $R^1$ is same or different and each independently hydrogen or C1 to C3 alkyl group, n is an integer of 2 to 4, $L_1$ has a valence of at least n,

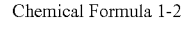

Chemical Formula 1-2 wherein in Chemical Formula 1-2, $L_1$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y^2$ is a single bond, —$(OCH_2CH_2)_m$— (wherein m is an integer of 1 to 10), sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), —RB— [wherein R is a C1 to C20 substituted or unsubstituted divalent linear or branched alkylene group, a C1 to C20 substituted or unsubstituted divalent linear or branched alkylene group having at least one methylene replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), or a combination thereof, or —(OCH$_2$CH$_2$)$_m$— (wherein m is an integer of 1 to 10) and B is sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), or a combination thereof], or a combination thereof, A is a C2 to C4 divalent alkylene group, n is an integer of 2 to 4, $L_1$ has a valence of at least n;

wherein the second monomer includes an ene compound represented by Chemical Formula 2:

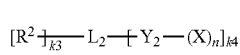 

Chemical Formula 2 wherein in Chemical Formula 2,

X is —CR=CR₂ or —C≡CR (wherein R is each independently hydrogen or a C1 to C3 alkyl group), R² is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —NH₂; a substituted or unsubstituted alkyl amine group (—NRR', wherein R and R' are independently hydrogen or a C1 to C30 linear or branched alkyl group provided that both of R and R' cannot be hydrogen at the same time); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group); or a combination thereof, $L_2$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—CH₂—) group is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, n is an integer of 1 or more, k3 is an integer of 0 or more, k4 is an integer of 1 or more, and the sum of n and k4 is an integer of 3 or more, provided that n does not exceed the valence of $Y_2$, and provided that the sum of k3 and k4 does not exceed the valence of $L_2$.

The first thiol compound may include a compound represented by Chemical Formula 1-1-1:

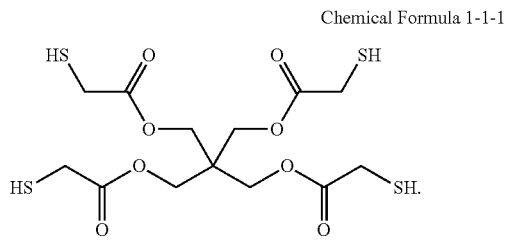 [SMILES: O=C(CS)OCC(COC(=O)CS)(COC(=O)CS)COC(=O)CS]

Chemical Formula 1-1-1

The first monomer may include the first thiol compound in an amount of less than or equal to about 70 mole percent based on a total amount of the first monomer.

The second thiol compound may include trimethylolpropane tris(3-mercaptopropionate) of Chemical Formula 1-2-1, pentaerythritol tetrakis(3-mercaptopropionate) of Chemical Formula 1-2-2, tris[2-(3-mercaptopropionyloxy)alkyl] isocyanurate of Chemical Formula 1-2-3, pentaerythritol tetrakis(3-mercaptobutylate), tris[2-(3-mercaptopropionyloxy)ethyl]isocyanurate, or a combination thereof:

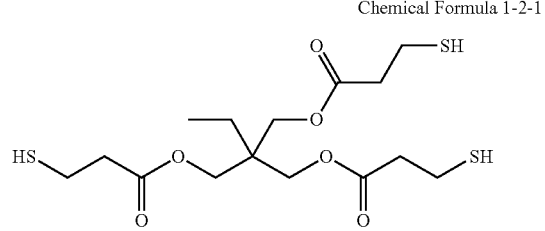

Chemical Formula 1-2-1

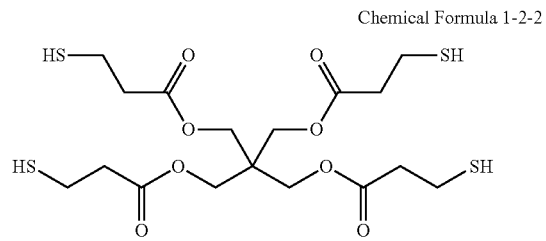

Chemical Formula 1-2-2

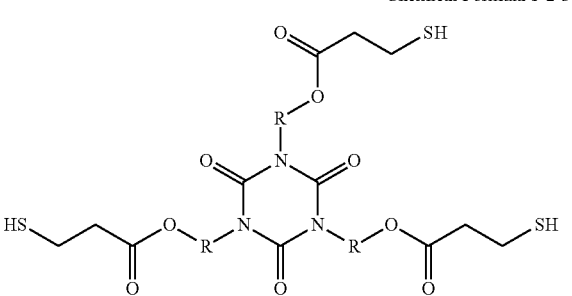

Chemical Formula 1-2-3 wherein R is a substituted or unsubstituted C1 to C10 alkylene group.

The ene compound may include a compound represented by Chemical Formula 2-1:

Chemical Formula 2-1

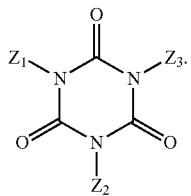

In Chemical Formulae 2-1, $Z_1$ to $Z_3$ are each independently *—$Y_2$—$(X)_n$ as defined in the Chemical Formula 2.

The ene compound may include a compound represented by Chemical Formula 2-1-1:

Chemical Formula 2-1

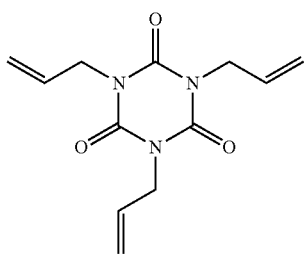

The ene compound may include a compound represented by Chemical Formula 2-2:

Chemical Formula 2-2

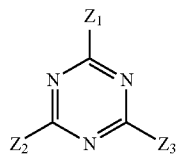

In Chemical Formulae 2-2, $Z_1$ to $Z_3$ are each independently *—$Y_2$—$(X)_n$ as defined in the Chemical Formula 2.

The first layer may further include an oxide particle dispersed in the polymerization product and the oxide particle may include $SiO_2$, a clay particle, or a combination thereof.

The amount of the clay particle may be less than or equal to about 5 percent by weight based on a total weight of the polymerization product.

The amount of the $SiO_2$ particle may be less than or equal to about 5 percent by weight based on a total weight of the polymerization product.

The layered structure may include a transparent substrate disposed on a surface of the first layer.

The layered structure may include a second layer disposed on a surface of the first layer.

The second layer may include an inorganic material that includes silicon, aluminum, titanium, or a combination thereof.

The second layer may include silicon oxide, silicon nitride, silicon carbide, silicon oxynitride, silicon oxycarbide, aluminum oxide, aluminum nitride, aluminum carbide, aluminum oxynitride, aluminum oxycarbide, titanium oxide, titanium nitride, titanium carbide, titanium oxynitride, titanium oxycarbide, or a combination thereof.

The first layer may have a thickness of less than or equal to about 40 micrometers.

The second layer may have an oxygen transmission rate of greater than or equal to about 0.01 cubic centimeters per square meter per day per atmosphere ($cc/m^2/day/atm$) and less than or equal to about 1 cubic centimeters per square meter per day per atmosphere ($cc/m^2/day/atm$) according to a JIS K7126-2 method or an ASTM D 3985 method.

The second layer may have a water vapor transmission rate of 0.01 grams per square meter per day ($g/m^2/day$) to 1 gram per square meter per day ($g/m^2/day$) according to a JIS K7129B method.

The layered structure may have a primer layer disposed directly on the second layer.

The first layer may be disposed directly on the primer layer.

The primer layer may have a thickness of less than or equal to about 3 micrometers.

The primer layer may include a silane compound.

The layered structure may not show melting when it is kept at 60° C. and under a relative humidity of 95% for 1,000 hours.

In some embodiments, a quantum dot sheet includes a photoconversion layer that includes a polymer matrix and a plurality of quantum dots dispersed in the polymer matrix; and the foregoing layered structure disposed on one or both surface(s) of the photoconversion layer, wherein the one or both surface(s) of the photoconversion layer faces the first layer of the layered structure.

The polymer matrix may include a thiol-ene polymer, a poly(meth)acrylate, a urethane polymer, an epoxy polymer, a vinyl polymer, a silicone polymer, or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

The quantum dot sheet may have a brightness of greater than or equal to about 90% of initial brightness after it is kept at 60° C. and under a relative humidity of 95% for 1,000 hours.

In other embodiments, a backlight unit may include the aforementioned quantum dot sheet.

In still other embodiments, an electronic device includes the foregoing quantum dot sheet.

According to some embodiments, the layered structure may have an enhanced stability even when it is subjected to harsh conditions of a high temperature and high humidity. When the layered structure is applied to the photoconversion layer including a quantum dot, the photoconversion layer may exhibit improved reliability of its luminous properties.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
FIG. 1 is a schematic view showing a cross-section of a layered structure according to an embodiment.

This disclosure will be described more fully hereinafter in the following detailed description, in which some but not all embodiments of this disclosure are described. This disclosure may be embodied in many different forms and is not to be construed as limited to the embodiments set forth herein; rather, these embodiments are provided so that this disclosure will fully convey the scope of the instant disclosure to those skilled in the art. Thus, in some exemplary embodiments, well-known technologies are not specifically explained to avoid ambiguous understanding of the present inventive concept. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. Unless otherwise defined, all terms used in the specification (including technical and scientific terms) may be used with meanings commonly understood by a person having ordinary knowledge in the art to which this invention belongs. Further, unless explicitly defined to the contrary, the terms defined in a generally-used dictionary should be interpreted as having a meaning that is consistent with their meaning in the context of the relevant art and the present disclosure, and are not ideally or excessively interpreted. In addition, unless explicitly described to the contrary, the word "comprise" and variations such as "comprises" or "comprising", and the word "include" and variations such as "includes" or "including", when used in this specification, specify the presence of stated features, regions, integers, steps, operations, elements, and/or components, but do not preclude the presence or addition of one or more other features, regions, integers, steps, operations, elements, components, and/or groups thereof. Therefore, the above words will be understood to imply the inclusion of stated elements but not the exclusion of any other elements.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As stated above, unless specifically described to the contrary, a singular form includes a plural form.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to a compound or group wherein at least one of hydrogen atoms thereof is substituted with a substituent a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' are independently hydrogen or a C1 to C6 alkyl group), an azido group (—$N_3$), an amidino group (—C(=NH)$NH_2$), a hydrazino group (—$NHNH_2$), a hydrazono group (=N($NH_2$), an aldehyde group (—C(=O)H), a carbamoyl group (—C(O)$NH_2$), a thiol group (—SH), ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—$SO_3$H) or a salt thereof (—$SO_3$M, wherein M is an organic or inorganic cation), a phosphoric acid group (—$PO_3H_2$) or a salt thereof (—$PO_3$MH or —$PO_3M_2$, wherein M is an organic or inorganic cation), or a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C30 alkyl" refers to a C1 to C30 alkyl group substituted with C6 to C30 aryl group, the total number of carbon atoms in the resulting aryl substituted alkyl group is C7 to C60.

As used herein, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, the term "hetero" refers to a moiety including one to three heteroatoms (N, O, S, Si, P, or a combination thereof).

As used herein, the term "alkyl group" may refer to a group derived from a straight or branched chain saturated aliphatic hydrocarbon having the specified number of carbon atoms and having a valence of at least one.

As used herein, the term "alkoxy group" may refer to "alkyl-O—", wherein the term "alkyl" has the same meaning as described above.

As used herein, the term "alkenyl group" may refer to a straight or branched chain, monovalent hydrocarbon group having at least one carbon-carbon double bond.

As used herein, the term "alkynyl group" may refer to a straight or branched chain, monovalent hydrocarbon group having at least one carbon-carbon triple bond.

As used herein, the term "cycloalkyl group" may refer to a monovalent group having one or more saturated rings in which all ring members are carbon.

As used herein, the term "aryl", which is used alone or in combination, may refer to an aromatic hydrocarbon group containing at least one ring and having the specified number of carbon atoms and not containing a heteroatom. The term "aryl" may be construed as including a group with an aromatic ring fused to at least one cycloalkyl ring.

The term "heteroaryl group" may refer to an aromatic (e.g., aryl) group including carbon and 1 to 3 heteroatoms selected from the group consisting of N, O, S, and P as ring atoms.

As used herein, the term "alkylene group" refers to a linear or branched saturated aliphatic hydrocarbon group having a valence of at least two, optionally substituted with one or more substituents where indicated, provided that the valence of the alkylene group is not exceeded.

As used herein, the term "alkenylene group" may refer to a straight or branched aliphatic hydrocarbon group having a valence of at least two, having at least one carbon-carbon double bond, optionally substituted with one or more substituents where indicated, provided that the valence of the alkenylene group is not exceeded.

As used herein, the term "cycloalkylene group" may refer to a cyclic hydrocarbon group having a valence of at least two, optionally substituted with one or more substituents where indicated, provided that the valence of the cycloalkylene group is not exceeded.

As used herein, the term "arylene group" refers to a functional group having a valence of at least two obtained by removal of at least two hydrogens in an aromatic ring consisting of carbon and hydrogen, optionally substituted with one or more substituents.

As used herein, the term "heteroarylene group" may refer to a functional group having a valence of at least two obtained by removal of at least two hydrogens in an aromatic ring, containing one to three heteroatoms selected from the group consisting of N, O, S, Si, and P as ring-forming elements, optionally substituted with one or more substituents where indicated, provided that the valence of the heteroarylene group is not exceeded.

As used herein, the term "hydrocarbyl group" refers to a monovalent group (e.g., alkyl group, an alkenyl group, an alkynyl group, or an aryl group) that is formed by removal of one hydrogen atom from a hydrocarbon such as alkane, alkene, alkyne, or an arene and optionally in which at least one remaining hydrogen atom may be substituted with a group as set forth above. In the hydrocarbyl group, at least one methylene (—$CH_2$—) moiety may be optionally replaced with an oxygen residual group (—O—), a carbonyl moiety, an ester moiety, an amide moiety, or a combination thereof.

As used herein, the term "(meth)acrylate" refers to acrylate and/or methacrylate.

As used herein, the term "normalized brightness" is related to a luminance change and may be a ratio (e.g., percentage) of the brightness of the device with respect to the initial brightness thereof.

In an embodiment, a layered structure includes a first layer including a polymerization product of a monomer combination including:

a first monomer having at least two thiol groups at its terminal end, and a second monomer having at least two carbon-carbon unsaturated bond-containing groups at its terminal end.

Hereinafter, such a polymerization product may be referred to as a thiol-ene polymer.

The first monomer includes a thioglycolate moiety containing a first thiol compound represented by Chemical Formula 1-1 and a second thiol represented by Chemical Formula 1-2:

Chemical Formula 1-1

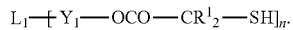

In Chemical Formula 1-1, $L_1$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond or a substituted or unsubstituted C1 to C4 alkylene group, $R^1$ is same or different and each independently hydrogen or C1 to C3 alkyl group, n is an integer of 2 to 4, $L_1$ has a valence of at least n, Chemical Formula 1-2

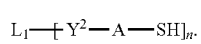

In Chemical Formula 1-2, $L_1$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y^2$ is a single bond, $-(OCH_2CH_2)_m-$ (wherein m is an integer of 1 to 10), sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 linear or branched alkyl group), $-RB-$ [wherein R is a C1 to C20 (e.g., C1 to C10 or C1 to C5 or C1 to C4) substituted or unsubstituted divalent linear or branched alkylene group, a C1 to C20 (e.g., C1 to C10 or C1 to C5 or C1 to C4) substituted or unsubstituted divalent linear or branched alkylene alkylene group having at least one methylene being replaced with sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 linear or branched alkyl group), or a combination thereof, or $-(OCH_2CH_2)_m-$ (wherein m is an integer of 1 to 10) and B is sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 linear or branched alkyl group), or a combination thereof], or a combination thereof, A is a C2 to C4 alkylene group (e.g., a divalent alkylene group), n is an integer of 2 to 4, and $L_1$ has a valence of at least n.

The second monomer includes an ene compound represented by Chemical Formula 2:

Chemical Formula 2

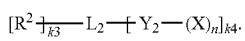

In Chemical Formula 2,

X is $-CR=CR_2$ or $-C\equiv CR$ (wherein R is each independently hydrogen or a C1 to C3 alkyl group), $R^2$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $-NH_2$; a substituted or unsubstituted alkyl amine group ($-NRR'$, wherein R and R' are independently hydrogen or a C1 to C30 linear or branched alkyl group provided that both of R and R' cannot be hydrogen at the same time); an isocyanate group; a halogen; $-ROR'$ (wherein R is a substituted or unsubstituted C1 to C20 alkylene group and R' is hydrogen or a C1 to C20 linear or branched alkyl group); an acyl halide ($-RC(=O)X$, wherein R is a substituted or unsubstituted alkylene group and X is a halogen); $-C(=O)OR'$ (wherein R' is hydrogen or a C1 to C20 linear or branched alkyl group); $-CN$; $-C(=O)ONRR'$ (wherein R and R' are independently hydrogen or a C1 to C20 linear or branched alkyl group); or a combination thereof, $L_2$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene ($-CH_2-$) group is replaced by sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 linear or branched alkyl group), imine ($-NR-$) (wherein R is hydrogen or a C1 to C10 linear or branched alkyl group), or a combination thereof, n is an integer of 1 or more, k3 is an integer of 0 or more, k4 is an integer of 1 or more, and the sum of n and k4 is an integer of 3 or more, provided that n does not exceed the valence of $Y_2$, and provided that the sum of k3 and k4 does not exceed the valence of $L_2$.

The first thiol compound may include a compound represented by Chemical Formula 1-1-1:

Chemical Formula 1-1-1

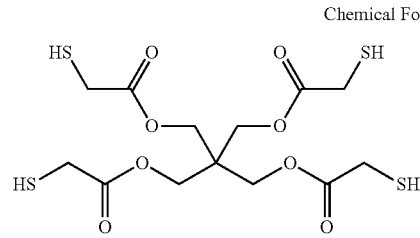

In the thiol compound of Chemical Formula 1-2, $Y^2$ may be a moiety including an ester bond. In some embodiments, $Y^2$ of Chemical Formula 1-2 includes an ester or a moiety including an ester. The ester included in the $Y^2$ may be directly adjacent to the A.

For example, the thiol compound may include trimethylolpropane tris(3-mercaptopropionate) of Chemical Formula 1-2-1, pentaerythritol tetrakis(3-mercaptopropionate) of Chemical Formula 1-2-2, tris[2-(3-mercaptopropionyloxy) alkyl] isocyanurate of Chemical Formula 1-2-3, pentaerythritol tetrakis(3-mercaptobutylate), tris[2-(3-mercaptopropionyloxy)ethyl]isocyanurate, or a combination thereof:

Chemical Formula 1-2-1

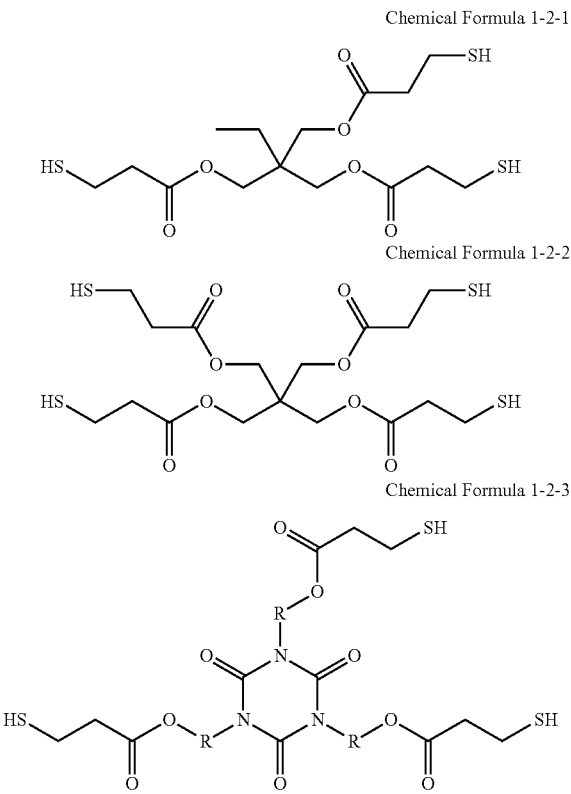

Chemical Formula 1-2-2

Chemical Formula 1-2-3 wherein R is a substituted or unsubstituted C1 to C10 alkylene group.

In some embodiments, the first monomer may include a mixture of pentaerythritol tetrakis(2-mercaptoacetate) and pentaerythritol tetrakis(3-mercaptopropionate).

In the first monomer, the amount of the first thiol compound may be less than or equal to about 70 mol %, for example, less than or equal to about 65 mol %, less than or equal to about 60 mol %, less than or equal to about 55 mol %, or less than or equal to about 50 mol %, based on a total amount of the first monomer. While not wishing to be bound by theory, it is understood that within the foregoing ranges, the first layer may be more stable at a high temperature and a high humidity and may exhibit more enhanced barrier properties.

The ene compound may include a compound represented by Chemical Formula 2-1:

Chemical Formula 2-1

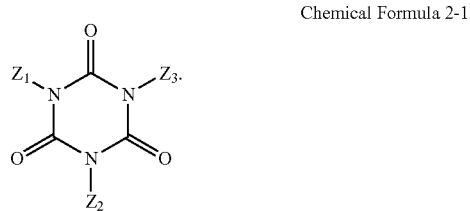

In Chemical Formulae 2-1, $Z_1$ to $Z_3$ are each independently *—$Y_2$—$(X)_n$ as defined in the Chemical Formula 2.

The ene compound may include a compound represented by Chemical Formula 2-1-1:

Chemical Formula 2-1-1

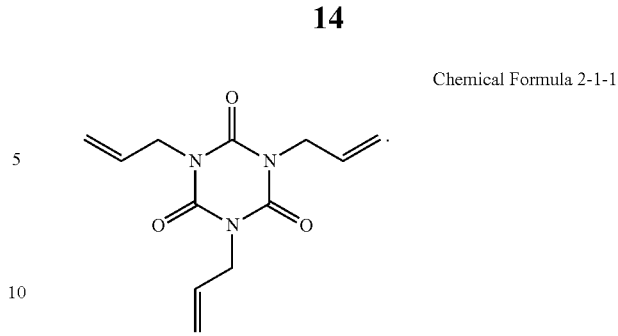

For the formation of the thiol-ene polymer, a ratio between the first monomer and the second monomer is not particularly limited and may be selected appropriately. For example, the mole ratio between the functional groups of the first and second monomers (e.g., the thiol group: a carbon-carbon unsaturated bond) may be about 1:0.5 to 1:1.5, for example, about 1:0.8 to 1:1.2, but it is not limited thereto.

The monomer combination for the formation of the thiol-ene polymer may further include an initiator. Examples of the initiator may include a phosphine oxide compound, an amino ketone, phenyl glyoxylate, monoacyl phosphine, a benzyl dimethyl ketal compound, a hydroxyketone compound, azobisisobutyronitrile, benzoyl peroxide, and the like, but are not limited thereto. The amount of the initiator may be from about 0.1 percent by weight (wt %) to about 3 wt % based on the total weight of the monomer combination, but is not limited thereto. In order to enhance storage stability of the monomer combination for the formation of the thiol-ene polymer, it may further include a curing inhibitor. Examples of the curing inhibitor may include methylhydroquinone, dibutylhydroxytoluene, tert-butylhydroxytoluene, and the like, but are not limited thereto. The curing inhibitor may be included in an amount of less than or equal to about 0.5 wt % based on the total weight of the monomer combination, but is not limited thereto.

The thiol-ene polymer is a crosslinked polymerization product prepared by a heat or light induced radical polymerization of a thiol monomer and an ene monomer (e.g., having a carbon-carbon unsaturated bond). A detailed mechanism thereof has been thoroughly investigated. Many compounds constituting the thiol monomer and the ene monomer may be prepared by any method, and some of them are commercially available. However, the barrier properties of the currently available thiol-ene polymers are not sufficient for use as a barrier layer of a quantum dot polymer composite. For example, the barrier properties of the currently available thiol-ene polymer fall significantly short of the levels that are required for the quantum dot polymer composite. Thus, the currently available thiol-ene polymer may not substitute for an inorganic material deposited polymer film, which is normally very expensive. In order to increase the barrier properties, an attempt has been made to introduce a functional group capable of acting through a dipole-dipole interaction or forming a hydrogen bonding with the monomers for the thiol-ene polymer. However, when the thiol-ene polymer prepared from such monomers is kept under a high-temperature and high-humidity condition (e.g., at 60° C. and under a relative humidity of about 95%), a melting phenomenon may occur. As used herein, the melting phenomenon refers to the state where a polymer fails to maintain its initial shape and deformed from its original state as determined by a naked eye. Without wishing to be bound by any theory, the melting phenomenon may become more significant as the position of the ester bond (OCO) become closer to the position of the sulfide bond. For example, the thioglycolate compound represented by Chemical Formula 1-1 may show poor stability under high temperature and high humidity condition because it has one carbon between the sulfide group (—S—) and the ester group.

The thiol compound (e.g., 2,2'-(ethylenedioxy)diethanthiol) that does not include an ester bond may show enhanced stability under a high temperature and high humidity condition. However, the thiol-ene polymer prepared from such a thiol compound has a significantly reduced operation reliability when it is used for a quantum dot polymer composite.

In some embodiments, the first layer of the layered structure may include a polymerization product of the foregoing first monomer and the foregoing second monomer, and thus, in the thiol-ene polymer included in the first layer, the number of the carbons between the ester moiety and the sulfide moiety (—S—) may vary (e.g., from 1 to 4, for example, 1 to 3, or 1 or 2). When such a thiol-ene polymer is used for a barrier layer of the quantum dot polymer composite, it may show improved barrier properties, and at the same time, may exhibit enhanced stability under high temperature and high humidity conditions. In some embodiments, the layered structure may not undergo a melting phenomenon when it is kept at 60° C. under a relative humidity of 95% for 1,000 hours.

The first layer may further include an oxide particle dispersed in the polymerization product. The oxide particle may include $SiO_2$, a clay particle, or a combination thereof. The size and the amount of the oxide particle are not particularly limited and may be selected appropriately as long as they do not adversely affect the performance of other elements (e.g., a photoconversion layer including quantum dots). The amount of the clay particle may be less than about 5 wt % based on a total weight of the polymerization product. The amount of the $SiO_2$ particle may be less than about 5 wt % based on a total weight of the polymerization product. For example, the size of the oxide particle may be greater than or equal to about 0.05 micrometers (um), for example, greater than or equal to about 0.1 um and less than or equal to about 10 um, but is not limited thereto. The oxide particle may be a nano particle, at least one dimension of which is a nano-size dimension.

Types and sizes of the clay are not particularly limited and may be properly selected. The clay particle may include smectite clay, mica clay, vermiculite clay, montmorillonite clay, iron-containing montmorillonite clay, beidellite clay, saponite clay, hectorite clay, stibensite clay, nontronite clay, anionic clay (e.g., layered double hydroxide or hydrotalcite), zirconium phosphate, kaolinite, atapulgite, illite, halloysite, diatomaceous earth, fuller's earth, calcined aluminum silicate, hydrated aluminum silicate, magnesium aluminum silicate, sodium silicate, and magnesium silicate, or a combination thereof. In an embodiment, the clay particle may have an average lateral size of about 50 nanometers (nm) to about 10 micrometers (um), and an average thickness of about 1 nm to about 10 nm.

The clay particle may include a surface modified clay particle with organic ligand. The surface modified clay particle includes the compound including a hydrocarbyl group linked to a heteroatom, and thus, may be a lipophilic (or hydrophobic) clay particle. The compound may include a tertiary amine, a quaternary organoammonium salt, a tertiary phosphine compound, a quaternary phosphonium salt, thiol compound including an amino group, or a combination thereof. The compound may include a tertiary amine compound including at least one of a substituted or unsubstituted C6 to C20 hydrocarbyl group (e.g., a substituted or unsubstituted C6 to C20 alkyl group, a substituted or unsubstituted C6 to C20 alkenyl group, or a combination thereof), a quaternary organoammonium salt compound including at least one of a substituted or unsubstituted C6 to C20 hydrocarbyl group (e.g., a substituted or unsubstituted C6 to C16 alkyl group, a substituted or unsubstituted C6 to C16 alkenyl group, or a combination thereof), a tertiary phosphine compound including at least one of a substituted or unsubstituted C6 to C20 hydrocarbyl group (e.g., a substituted or unsubstituted C6 to C16 alkyl group, a substituted or unsubstituted C6 to C16 alkenyl group, or a combination thereof), a quaternary organophosphonium salt compound including at least one of a substituted or unsubstituted C6 to C20 hydrocarbyl group (e.g., a substituted or unsubstituted C6 to C20 alkyl group, a substituted or unsubstituted C6 to C20 alkenyl group, or a combination thereof), and a C6 or greater (e.g., C6 to C20) mercaptane compound including an amino ($H_2N$—) group, or a combination thereof.

The compound may include hexylamine, a dioctadecyldimethylammonium salt, a methyltrioctylammonium salt, a hexyltriphenylphosphonium salt, a tributylmethylphosphonium salt, a triethylpentylphosphonium salt, 8-amino-1-octanethiol, a triethyloctylphosphonium salt, tetraphenylphosphonium, or a combination thereof.

The layered structure may include a transparent substrate 500 and the first layer 100 disposed on the transparent substrate (FIG. 1). The transparent substrate is not particularly limited. The transparent substrate may be optically transparent and may have a light transmittance of greater than or equal to about 90% with respect to light having a wavelength of about 400 nm to 700 nm. The thickness of the transparent substrate is not particularly limited and may be selected appropriately. For example, the thickness of the transparent substrate may be from about 10 um to about 250 um. The transparent substrate may be glass, poly(meth) acrylate, polyester such as polyethylene terephthalate (PET), polybutylene terephthalate (PBT), and polyethylene naphthalate (PEN), polyarylate, polycarbonate, a polyolefin such as polyethylene and polypropylene, a vinyl polymer such as polystyrene and polyvinyl chloride, a cyclic olefin polymer (COP), polyimide, (aliphatic or aromatic) polyamide (e.g., nylon, aramide, and the like), polyether ether ketone, polysulfone, polyether sulfone, polyamide imide, polyether imide, a thiol-ene polymer, or a combination thereof, but they are not limited thereto. The substrate may include a metal oxide such as $Al_2O_3$, SiN, SiON, $TiO_2$, $ZrO_2$, ZnO, and the like; a metal (e.g., a metal thin film) including Au, Al, Ag, Pt, Cu, or the like; an organic-inorganic hybrid material such as silsesquioxane; or a combination thereof.

As used herein, the term "cyclic olefin polymer" refers to a polymer that is prepared by preparing a cyclic olefin monomer via a reaction between a cyclic ene compound (e.g., cyclopentene, norbornene, dicyclopentadiene, or the like) and a chain type olefin compound such as ethylene, propylene, or butylene and polymerizing the obtained cyclic olefin monomer.

In some embodiments, the layered structure may include a second layer 200 (e.g., an inorganic layer) disposed on one side of the first layer 100. For example, the layered structure may include the second layer 200 between the transparent substrate 500 and the first layer 100. The second layer may include silicon (Si), aluminum (Al), titanium (Ti), or a combination thereof. The second layer may include a silicon oxide, a silicon nitride, a silicon carbide, a silicon oxynitride (oxynitride), a silicon oxycarbide(oxycarbide), an aluminum oxide, an aluminum nitride, an aluminum carbide, an aluminum oxynitride, an aluminum oxycarbide, a titanium oxide, a titanium nitride, a titanium carbide, a titanium oxynitride, a titanium oxycarbide, or a combination thereof.

In some embodiments, the layered structure may show improved barrier properties even when the barrier properties of the second layer themselves are relatively low. For example, when a measurement is carried out in accordance with a JIS K7126-2 method or an ASTM D 3985 method at 23° C. and 0% of relative humidity, for example, by using Oxytran (Mocon Inc.), the second layer may have an oxygen transmission rate (OTR) of greater than or equal to about 0.01 cubic centimeters per square meter per day per atmosphere ($cc/m^2/day/atm$), for example, greater than or equal to about 0.02 $cc/m^2/day/atm$, greater than or equal to about 0.03 $cc/m^2/day/atm$, greater than or equal to about 0.04 $cc/m^2/day/atm$, greater than or equal to about 0.05 $cc/m^2/day/atm$, greater than or equal to about 0.06 $cc/m^2/day/atm$, greater than or equal to about 0.07 $cc/m^2/day/atm$, greater than or equal to about 0.08 $cc/m^2/day/atm$, greater than or equal to about 0.09 $cc/m^2/day/atm$, greater than or equal to about 0.10 $cc/m^2/day/atm$, greater than or equal to about 0.15 $cc/m^2/day/atm$, greater than or equal to about 0.20 $cc/m^2/day/atm$, greater than or equal to about 0.25 $cc/m^2/day/atm$, greater than or equal to about 0.30 $cc/m^2/day/atm$, greater than or equal to about 0.40 $cc/m^2/day/atm$, or greater than or equal to about 0.50 $cc/m^2/day/atm$.

When a measurement is carried out in accordance with a JIS K7126-2 method or an ASTM D 3985 method at 23° C. and 0% of relative humidity, for example, by using Oxytran (Mocon Inc.), the second layer may have an oxygen transmission rate (OTR) of less than or equal to about 1 $cc/m^2/day/atm$, for example, less than or equal to about 0.9 $cc/m^2/day/atm$, less than or equal to about 0.8 $cc/m^2/day/atm$, less than or equal to about 0.7 $cc/m^2/day/atm$, or less than or equal to about 0.6 $cc/m^2/day/atm$.

When a measurement is carried out in accordance with a JIS K7129B method at 37° C. and 100% of relative humidity, for example, by using Aquatran (Mocon. Inc), the second layer may have a water vapor transmission rate (WVTR) of greater than or equal to about 0.01 grams per square meter per day (0.01 $g/m^2/day$), for example, greater than or equal to about 0.02 $g/m^2/day$, greater than or equal to about 0.03 $g/m^2/day$, greater than or equal to about 0.04 $g/m^2/day$, greater than or equal to about 0.05 $g/m^2/day$, greater than or equal to about 0.06 $g/m^2/day$, greater than or equal to about 0.07 $g/m^2/day$, greater than or equal to about 0.08 $g/m^2/day$, greater than or equal to about 0.09 $g/m^2/day$, greater than or equal to about 0.10 $g/m^2/day$, greater than or equal to about 0.15 $g/m^2/day$, greater than or equal to about 0.20 $g/m^2/day$, greater than or equal to about 0.25 $g/m^2/day$, greater than or equal to about 0.30 $g/m^2/day$, greater than or equal to about 0.40 $g/m^2/day$, or greater than or equal to about 0.50 $g/m^2/day$.

When a measurement is carried out in accordance with a JIS K7129B method at 37° C. and 100% of relative humidity, for example, by using Aquatran (Mocon. Inc), the second layer may have an water vapor transmission rate of less than or equal to about 1 $g/m^2/day$, for example, less than or equal to about 0.9 $g/m^2/day$, less than or equal to about 0.8 $g/m^2/day$, less than or equal to about 0.7 $g/m^2/day$, or less than or equal to about 0.6 $g/m^2/day$.

The second layer has the aforementioned barrier properties so that it may not be used alone for a barrier layer of a quantum dot polymer composite. For example, a barrier including the second layer without the first layer has poor barrier properties (e.g., high oxygen/water vapor permeability). In addition, cracks may easily occur due to a poor durability. However, when the second layer is combined with the first layer to form a barrier, the resulting barrier may show such an enhanced barrier properties that it becomes suitable to a quantum dot polymer composite.

Quantum dots have high color purity and high quantum efficiency. Thus, they have been used for a photoconversion layer in various electronic devices such as a display, a lighting, and the like. However, luminous properties of the quantum dots may significantly decrease due to external environment, such as water and oxygen, and measures for this drawback are necessary. Currently, as a barrier element for protecting a photoconversion layer including the quantum dots, a polymer film having a vapor-deposited inorganic layer (e.g., via sputtering, for example, a $SiO_x$ layer) are used. However, in order for the polymer film having the deposited inorganic layer to be used as the barrier element for the photoconversion layer including the quantum dots, they may be required to have a high level of oxygen and water barrier properties (e.g., of less than or equal to about 0.01 $g/cm^2/day$). For such a high level of the barrier properties, the inorganic layer should be vapor-deposited with substantially no defect, which entails very expensive vapor deposition equipment and materials and fine control of the deposition conditions. In addition, for such a high level of the barrier properties, the uniformity of the thickness should be secured by using an under-coating and an over-coating and a protective layer may also be necessary. Therefore, the barrier film for the quantum dot polymer composite is normally very expensive, which may seriously weakens the cost competitiveness of the quantum dot polymer composite.

In some embodiments, the layered structure includes the first layer including the foregoing thiol-ene polymer, and thereby, it may be effectively used in the barrier element of the quantum dot polymer composite even when the second layer has various defects and a low level of barrier properties. Accordingly, using the layered structure of the embodiments may reduce the production cost of the quantum dot sheet. Without wishing to be bound by any theory, it is believed that the aforementioned thiol-ene polymer included in the first layer may effectively compensate various defects (e.g., cracks) that may be present on the second layer and the layered structure may show improved barrier properties (e.g., reduced oxygen and water vapor permeability) as a whole structure.

The thickness of the first layer may be greater than or equal to about 1 um, for example, greater than or equal to about 5 um, greater than or equal to about 10 um, greater than or equal to about 15 um, or greater than or equal to about 20 um. The thickness of the first layer may be less than or equal to about 500 um, for example, less than or equal to about 400 um, less than or equal to about 300 um, less than or equal to about 250 um, less than or equal to about 200 um, less than or equal to about 150 um, less than or equal to about 100 um.

Figure 3:
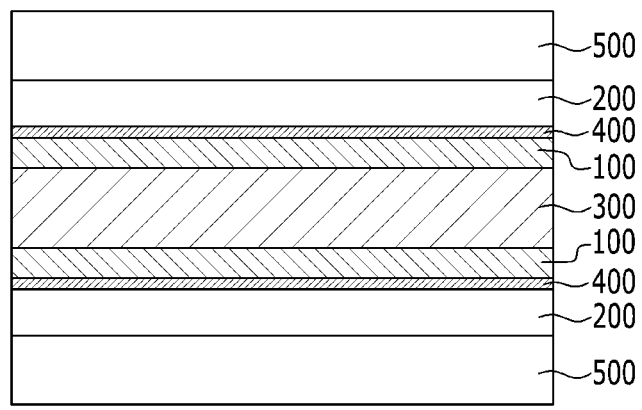
FIG. 3 is a schematic view showing a cross-section of a quantum dot sheet according to still another embodiment.

The layered structure including the first layer and the second layer may have a reduced thickness. For example, in the layered structure including the first layer and the second layer, the first layer may have a thickness of less than or equal to about 40 um, for example, less than or equal to about 30 um, or less than or equal to about 25 um. The first layer may have a thickness of greater than or equal to about 10 um, but it is not limited thereto. The thickness of the second layer (e.g., inorganic thin film layer) is not particularly limited and may be selected appropriately. In some non-limiting embodiments, the second layer may have a thickness of less than or equal to about 1 um, for example, less than or equal to about 0.5 um but it is not limited thereto. The first layer and the second layer may form a slim set structure, and thereby, the layered structure may have a thin total thickness while it may provide improved barrier properties. In some embodiments, the layered structure may have substantially the same level of the barrier properties as those of an expensive deposition type barrier element, while it may be produced at a greatly reduced cost (e.g., being about half the cost of the deposition type barrier element). In order to increase adhesion between the first layer 100 and the second layer 200, a primer layer 400 may be disposed between the second layer and the first layer (FIG. 3). For example, the primer layer may be disposed directly on the second layer, and the first layer may be disposed directly on the primer layer.

The primer layer may have a thickness of less than or equal to about 3 um, for example, less than or equal to about 2 um, or less than or equal to about 1 um. The primer layer may include a silane compound, examples of which includes a (meth)acrylate silane, an alkyl chain silane, a thiol silane, but it is not limited thereto.

Figure 2A:
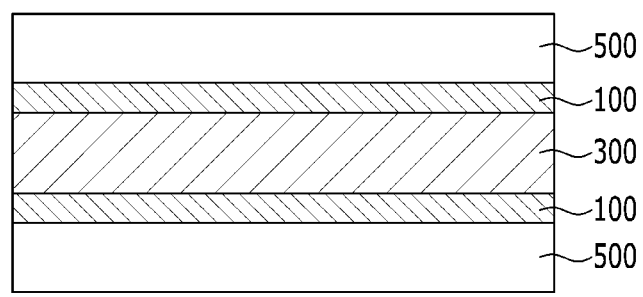
FIG. 2A is a schematic view showing a cross-section of a quantum dot sheet according to an embodiment.
Figure 2B:
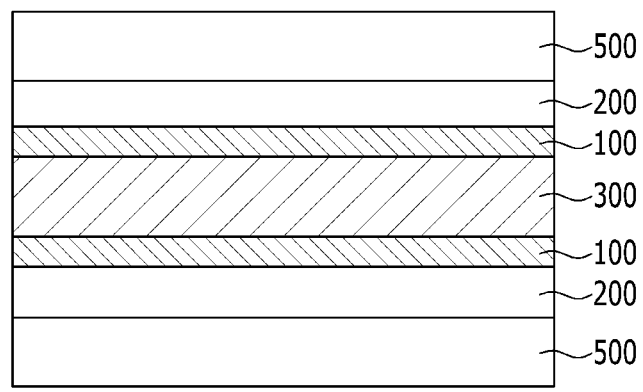
FIG. 2B is a schematic view showing a cross-section of a quantum dot sheet according to another embodiment.

In other embodiments, a quantum dot sheet may include a photoconversion layer 300 that includes a polymer matrix and a plurality of quantum dots dispersed in the polymer matrix; and the foregoing layered structure disposed on one or both surface(s) of the photoconversion layer with the surface of the photoconversion layer 300 facing the first layer 100 of the layered structure (FIG. 2 and FIG. 3). For example, the first layer 100 may be disposed on (or disposed directly on) the photoconversion layer 300.

The polymer matrix may include a thiol-ene polymer, a poly(meth)acrylate, a urethane polymer, an epoxy polymer, a vinyl polymer, a silicone polymer, or a combination thereof. As used herein, the term "thiol-ene" polymer refers to a polymerization product of a monomer combination including a first monomer having at least two thiol groups at its terminal end and a second monomer having at least two carbon-carbon unsaturated bond-containing groups at its terminal end.

The poly(meth)acrylate may include a polymer of at least one (meth)acrylate monomer, at least one (meth)acrylate oligomer, or a combination thereof.

Examples of the (meth)acrylate monomer includes isobornyl (meth)acrylate, isooctyl (meth)acrylate, lauryl (meth) acrylate, benzyl (meth)acrylate, norbornyl (meth)acrylate, cyclohexyl (meth)acrylate, n-hexyl (meth)acrylate, butyl (meth)acrylate, adamantyl acrylate, cyclopentyl acrylate, ethylene glycol di(meth)acrylate, hexane diol di(meth)acrylate, tricyclodecane dimethanol di(meth)acrylate, and trimethylolpropane tri(meth)acrylate, and the like, but are not limited thereto.

Examples of the (meth)acrylate oligomer that can be used are urethane (meth)acrylate, epoxy (meth)acrylate, polyester (meth)acrylate, acrylic (meth)acrylate, polybutadiene (meth)acrylate, silicone (meth)acrylate, and melamine (meth)acrylate, but are not limited thereto. The (meth) acrylate oligomer may have an average molecular weight of about 1,000 to about 20,000 g/mol, but it is not limited thereto. Such polymerizable oligomer may be prepared by any method or is commercially available.

Examples of the epoxy polymer and the silicone polymer are resin that are known in the art or commercially available, but are not limited thereto.

Examples of the vinyl polymer include polystyrene, polyvinyl pyrrolidone, polyvinyl chloride, and polyvinyl alcohol, but are not limited thereto.

The photo-conversion layer includes a plurality of quantum dots that are dispersed in the polymer matrix. The quantum dot (hereinafter, also referred to as a semiconductor nanocrystal) is not particularly limited, and may be any known or commercially available ones. For example, the quantum dot may include a Group II-VI compound, a Group III-V compound, a Group IV-VI compound, a Group IV element or compound, a Group I-III-VI compound, a Group I-II-IV-VI compound, or a combination thereof. The amount of the quantum dot included in the photoconversion layer is not particularly limited and may be selected appropriately.

The Group II-VI compound may be a binary element compound such as CdSe, CdTe, ZnS, ZnSe, ZnTe, ZnO, HgS, HgSe, HgTe, MgSe, MgS, or a combination thereof;

a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group II-VI compound may further include a Group III metal such as indium.

The Group III-V compound may be a binary element compound such as GaN, GaP, GaAs, GaSb, AlN, AlP, AlAs, AlSb, InN, InP, InAs, InSb, or a combination thereof;

a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; and a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group IV-VI compound may be a binary element compound such as SnS, SnSe, SnTe, PbS, PbSe, PbTe, or a combination thereof;

a ternary element compound such as SnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof.

The Group III-V compound may further include a Group II metal such as Zn (e.g., InZnP).

Examples of the Group I-III-VI compound include CuInSe$_2$, CuInS$_2$, CuInGaSe, and CuInGaS, but are not limited thereto.

Examples of the Group I-II-IV-VI compound include CuZnSnSe and CuZnSnS, but are not limited thereto.

The Group IV element or compound may be a singular element such as Si, Ge, or a combination thereof; and a binary element compound such as SiC, SiGe, or a combination thereof.

The binary element compound, the ternary element compound, or the quaternary element compound may be present in a uniform concentration in a particle, or may be present in a locally different concentration in a single particle.

The semiconductor nanocrystal may have a core/shell structure, wherein a semiconductor nanocrystal (e.g., a shell) surrounds another (different) semiconductor nanocrystal (e.g., a core). The core and shell may have an interface, and an element in at least one of the core and the shell in the interface may have a concentration gradient, wherein the concentration of the element(s) of the shell decreases or increase toward the core. The semiconductor nanocrystal may have one core of a semiconductor nanocrystal and multi-shells surrounding the core. The core and multi-shell structure has at least two shells, wherein each shell may be a single composition, an alloy, or the one having a concentration gradient.

In addition, in the semiconductor nanocrystal, the materials of the shell may have a larger energy bandgap than that of the core, and thereby, the semiconductor nanocrystal may exhibit a quantum confinement effect more effectively. In case of a multi-shell type of semiconductor nanocrystal particle, the energy bandgap of the material of an outer shell may be greater than that of the material of an inner shell (a shell that is closer to the core). In this case, the semiconductor nanocrystal may emit light of a wavelength ranging from UV to infrared light.

The semiconductor nanocrystal may have quantum efficiency of greater than or equal to about 50%, for example, greater than or equal to about 60%, greater than or equal to about 70%, or greater than or equal to about 90%. The aforementioned range may increase the luminous efficiency of the device. The semiconductor nanocrystal absorbs blue light and emits green light having a wavelength of about 520 nm to about 550 nm or red light having a wavelength of about 590 nm to about 650 nm.

In order to realize enhanced color purity or color reproducibility, the semiconductor nanocrystal may be designed to have a narrower full width at half maximum (FWHM) in its photoluminescence spectrum. The semiconductor nanocrystal may have a FWHM of less than or equal to about 45 nanometers (nm), for example less than or equal to about 40 nm, or less than or equal to about 30 nm.

The quantum dot may have a particle size (e.g., a diameter or the longest length of a straight line across a non-spherical particle) ranging from about 1 nm to about 100 nm, for example, about 1 nm to 20 nm. In some embodiments, the quantum dot have a particle size of greater than or equal to about 2 nm, greater than or equal to about 3 nm, greater than or equal to about 4 nm, or greater than or equal to about 5 nm. In some embodiments, the quantum dot have a particle size of less than or equal to about 50 nm, less than or equal to about 40 nm, less than or equal to about 30 nm, or less than or equal to about 20 nm.

The shape of the quantum dot is not particularly limited. By way of an example, the quantum dot may have a spherical shape, an ellipsoid shape, a pyramidal shape, a multi-pod shape, or a cubic shape. The quantum dot may be in the form of a nanoparticle, a nanotube, a nanowire, a nanorod, or a nanosheet.

The quantum dot is commercially available or may be prepared by any method. For example, the quantum dot may be prepared by the method described hereinbelow, but it is not limited thereto.

In a non-limiting example, the quantum dot having a several nanometer size may be prepared via a wet chemical method. In the wet chemical method, precursors react in an organic solvent to grow nanocrystal particles, and the organic solvent or a ligand compound may coordinate to the surface of the quantum dot, thus controlling the crystal growth. The ligand compound may be any organic compound that may be used as a ligand compound in the wet chemical method, and the types thereof are not particularly limited. For example, the ligand compound may be RCOOH, $RNH_2$, $R_2NH$, $R_3N$, RSH, $R_3P(=O)$, $R_3P$, ROH, $RC(=O)OR'$, $RP(=O)(OH)_2$, $R_2P(=O)OH$ (wherein R and R' are independently a substituted or unsubstituted C5 to C24 aliphatic hydrocarbon group such as alkyl or alkenyl group or a substituted or unsubstituted C5 to C20 aromatic hydrocarbon group such as an aryl group), a polymeric ligand, or a combination thereof. The organic ligand may have a hydrophobic group. The organic ligand may be bound to a surface of the quantum dot.

Examples of the organic ligand may include, but are not limited to: a thiol such as methane thiol, ethane thiol, propane thiol, butane thiol, pentane thiol, hexane thiol, octane thiol, dodecane thiol, hexadecane thiol, octadecane thiol, and benzyl thiol; an amine such as methane amine, ethane amine, propane amine, butane amine, pentane amine, hexane amine, octane amine, dodecane amine, hexadecyl amine, octadecyl amine, dimethyl amine, diethyl amine, and dipropyl amine; an acid such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; a phosphine such as methyl phosphine, ethyl phosphine, propyl phosphine, butyl phosphine, pentyl phosphine, and the like; a phosphine oxide compound such as methyl phosphine oxide, ethyl phosphine oxide, propyl phosphine oxide, butyl phosphine oxide, and the like; diphenyl phosphine, a triphenyl phosphine compound or an oxide compound thereof; and alkyl phosphonic acid. The organic ligand compound may be used alone or as a combination of two or more compounds.

The photoconversion layer may be prepared by mixing the quantum dots and the monomers or the oligomers for the polymer matrix and carrying out a polymerization reaction, but it is not limited thereto.

In some embodiments, a backlight unit may include a light source and the foregoing quantum dot sheet. In some non-limiting embodiments, the backlight unit includes a light guide panel (LGP) disposed between the light source and the quantum dot sheet. A reflector (not shown) may be further disposed on the lower surface of the light guide panel. The backlight unit may further include a diffusing plate above the light guide panel. The quantum dot sheet may be disposed between the LGP and the diffusing plate or on a side of the diffusion plate which is opposite the light guide panel.

When the light emitted from the light source is passed through the photoconversion layer, a light having a wavelength different from the light emitted from the light source is emitted. For example, when the light emitted from the light source is passed through the photoconversion layer, blue light, green light, and red light are mixed to emit white light. By changing the compositions and sizes of semiconductor nanocrystals in the photoconversion layer, the ratio of the blue light, green light, and red light may be controlled. The emitted light may show improved color reproducibility and color purity.

In an embodiment, the photoconversion layer may include a plurality of layers. On the photoconversion layer, an optical film, e.g., a diffusion plate, a prism sheet, a microlens sheet, a brightness enhancement film, or a combination thereof, may be further disposed. The backlight unit may be used in a display such as a liquid crystal display. A schematic cross-section view of a liquid crystal display including the backlight unit is shown in FIG. 4A and FIG. 4B.

Figure 4A:
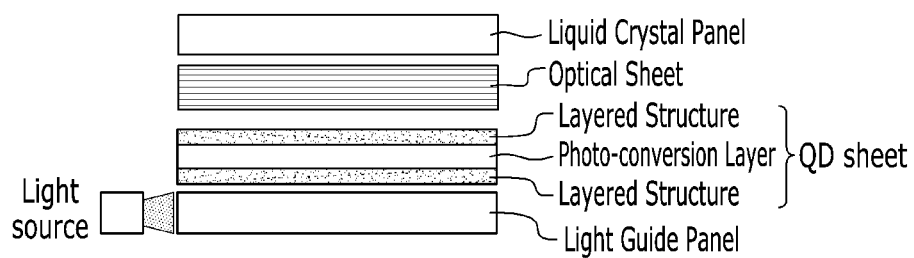
FIG. 4A is a schematic view showing a backlight unit and an electronic device (a liquid crystal display) in an edge type.
Figure 4B:
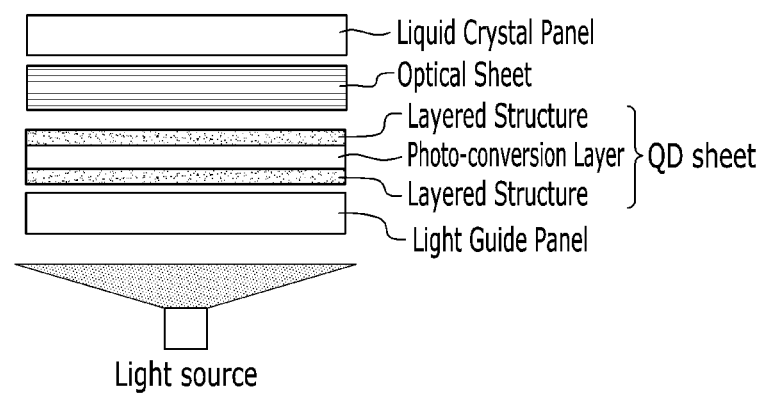
FIG. 4B is a schematic view showing a backlight unit and an electronic device (a liquid crystal display) in a direct type.

Referring to FIG. 4A and FIG. 4B, the liquid crystal display may have a backlight unit including a light source, a light guide panel, the foregoing quantum dot sheet, and an optical sheet and a liquid crystal panel disposed on the backlight unit. The liquid crystal panel provides a predetermined color image using the white light incident from the backlight unit. The liquid crystal panel may have a structure in which a first polarizer, a liquid crystal layer, a color filter, and optionally a second polarizer are disposed on each other. The liquid crystal panel is not particularly limited, and any liquid crystal panel that is known in the art or is commercially available may be included.

Hereinafter, the embodiments are illustrated in more detail with reference to examples. However, they are exemplary embodiments of the present disclosure, and the present inventive concept is not limited thereto.

EXAMPLES

Measurement
[1] Brightness and Color Coordinate of the Quantum Dot Sheet

The quantum dot sheet is inserted between a light guide plate and an optical sheet of a 60 inch TV equipped with a blue LED having a peak wavelength of 449 nm, and then, the TV is operated to measure brightness at about 45 centimeters (cm) in front of the TV with a spectroradiometer (manufactured by Konica Minolta Co., Ltd., CS-2000).

[2] Glass Transition Temperature

A glass transition temperature is measured with a differential scanning calorimetry (TA, Discovery DSC) at a scan rate of 10 Celsius degrees per minute (° C./min).

Reference Example 1: Production of Bare Semiconductor Nanocrystals (1) 0.2 millimoles (mmol) of indium acetate, 0.6 mmol of palmitic acid, and 10 milliliters (mL) of 1-octadecene are placed in a flask, subjected to a vacuum state at 120° C. for one hour, and then, heated to 280° C. after the atmosphere in the flask is exchanged with $N_2$. Then, a mixed solution of 0.1 mmol of tris(trimethylsilyl)phosphine ($TMS_3P$) and 0.5 mL of trioctylphosphine (TOP) is quickly injected, and the reaction proceeds for 20 minutes. The reaction mixture then is rapidly cooled and acetone is added thereto to produce nanocrystals, which are then separated by centrifugation and dispersed in toluene. The first absorption maximum in UV-VIS spectrum of the InP core nanocrystals thus prepared is in the range of 420 to 600 nm.

0.3 mmol (0.056 grams, g) of zinc acetate, 0.6 mmol (0.189 g) of oleic acid, and 10 mL of trioctylamine are placed in a flask, subjected to a vacuum state at 120° C. for 10 minutes, and then heated to 220° C. after the atmosphere in the flask is exchanged with $N_2$. Then, a toluene dispersion of the InP core nanocrystals prepared above (optical density: 0.15) and 0.6 mmol S/TOP (i.e., sulfur dissolved or dispersed in the sulfur) are added to the flask, and then, the resulting mixture is heated to 280° C., and the reaction proceeds for 30 minutes. After the reaction, the reaction solution is quickly cooled to room temperature to obtain a reaction mixture including InP/ZnS semiconductor nanocrystals.

(2) An excess amount of ethanol is added to the reaction mixture including the InP/ZnS semiconductor nanocrystals, which is then centrifuged to remove an extra organic material from the reaction mixture of the semiconductor nanocrystals. After centrifugation, the supernatant is discarded and the precipitate is dispersed in toluene again, and an excess amount of ethanol is added thereto and the resulting mixture is centrifuged again. The precipitate obtained from the centrifugation is dried and dispersed in chloroform. A UV-vis absorption spectrum of the resulting dispersion is measured. The prepared semiconductor nanocrystals emit green or red light.

Reference Example 2: Preparation of a Composition for a Photoconversion Layer 30 parts by weight of lauryl methacrylate (as a monomer), 36 parts by weight of tricyclodecane dimethanol diacrylate (as a monomer), 4 parts by weight of trimethylol propane triacrylate (as a monomer), and 20 parts by weight of epoxy diacrylate oligomer (from Sartomer) (as an oligomer), 1 parts by weight of 1-hydroxy-cyclohexyl-phenyl-ketone, and 1 parts by weight of 2,4,6-trimethylbenzoyl-diphenyl-phosphine oxide are mixed to prepare a mixture. The mixture is defoamed under vacuum.

Semiconductor nanocrystals are centrifuged once in the same manner as Reference Example 1. The resulting toluene dispersion of the semiconductor nanocrystals is mixed with an excess amount of ethanol and then centrifuged. The semiconductor nanocrystals thus separated are dispersed in 0.15 g of lauryl methacrylate (as a monomer), and then added to 1.35 g of the prepared monomer-oligomer mixture and vortexed to prepare a quantum dot composition.

Experimental Example 1: Comparison of Barrier Properties Depending on a Thiol Structure I

[1] pentaerythritol tetrakis(3-mercaptopropionate) (THIOCURE PETMP, manufacturer: Bruno Bock Chem., hereinafter 4T) and 1,3,5-triallyl-1,3,5-triazine-2,4,6(1H,3H,5H)-trione (TAIC, manufacturer: Nippon Kasei Chemical, hereinafter TTT are mixed at a weight ratio of 60/40=4T/TTT. Irgacure TPO (Manufacturer: BASF) is added thereto in an amount of 1 wt % based on a total weight of the mixture of 4T/TTT to form a composition for the formation of the first layer.

The composition for the formation of the $1^{st}$ layer, thus obtained, is bar-coated on a 50 micrometer (μm)-thick PET base film with a wire bar and then is exposed to ultraviolet (UV) radiation (light intensity: 150 milliwatts per square centimeter, $mW/cm^2$) for 10 seconds to obtain a layered structure including a first layer having a predetermined thickness set forth in Table 1 and a PET substrate. The same procedure is repeated to prepare the same layered structure as above.

1 g of the quantum dot composition prepared in Reference Example 2 is drop-casted on a surface of the first layer of the layered structure. Another layered structure, thus prepared, is disposed on the coated quantum dot composition to contact a surface of the first layer thereof with the coated quantum dot composition and UV curing is carried out for 10 seconds at a light intensity of 100 $mW/cm^2$ to prepare a quantum dot sheet having a structure shown in FIG. 2A (i.e., QD sheet 1, QD sheet 2, QD sheet 5, and QD sheet 6).

[2] QD sheet 3, QD sheet 4, QD sheet 7, QD sheet 8, and QD sheet 9 are prepared in the same manner as set forth above except that pentaerythritol tetrakis(2-mercaptoacetate) (purchased from Maruzen chemical trading, hereinafter PETSA) is used instead of 4T to form a mixture having a weight ratio of PETSA/TTT=57/43.

[3] QD sheet 10 is prepared in the same manner as set forth above except that pentaerythritol tetrakis(3-mercaptobutylate) (purchased from Maruzen chemical trading, hereinafter PE1) is used instead of 4T to form a mixture having a weight ratio of PE1/TTT=61.8/38.2.

[4] QD sheet 1, QD sheet 2, QD sheet 3, and QD sheet 4 are inserted to a TV set, which is then operated to measure the brightness and the color coordinate. The results are shown in FIG. 5 and Table 1.

TABLE 1

| sample | QD sheet 1 | QD sheet 2 | QD sheet 3 | QD sheet 4 |
|---|---|---|---|---|
| Composition of the first layer | 4T/TTT (60/40) | | PETSA/TTT (57/43) | |
| Thickness of the first layer (um) | 95 | 90 | 94 | 92 |
| Operating time at 60° C. (h) | 1650 h | | | |
| normalized brightness | 63.4% | 76.8% | 87.1% | 90.5% |
| Δ Cx | −0.0183 | −0.0122 | −0.0054 | −0.0045 |
| Δ Cy | −0.0641 | −0.0378 | −0.0182 | −0.0135 |

Figure 5:
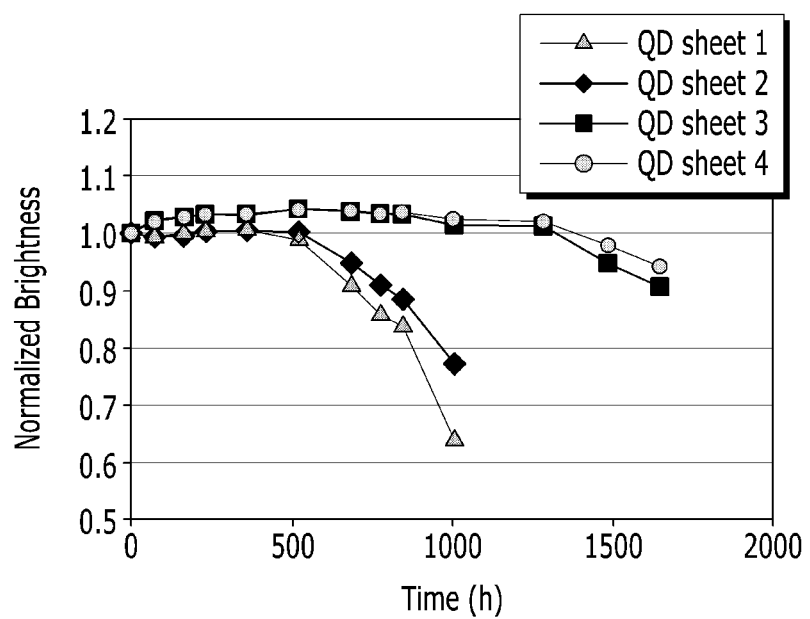
FIG. 5 is a graph of normalized brightness versus time (hours, h) showing results of Experimental Example 1.

The results of Table 1 and FIG. 5 show that QD sheet 3 and QD sheet 4 (using PETSA as the first monomer) has significantly enhanced barrier properties in comparison with the layered structure using 4T as the first monomer.

[5] On a 50 um thick PET base film, a $SiO_x$ (e.g., $SiO_2$) inorganic oxide layer is formed to prepare a film having an OTR of about 0.01 cc/m²/day/atm and WVTR of about 0.01 g/cm²/day. Using this barrier film, a QD sheet is prepared in the same manner as set forth in [1]. The QD sheet thus obtained is referred to as "ref sheet."

Ref sheet and QD sheet 5 are stored at 60° C. and under a relative humidity of 95% for a predetermined time, and then, inserted into an operating TV set at room temperature for a predetermined time (aging) set forth in Table 2. Over the time of the operation, changes in the brightness and the color coordinate are observed.

Figure 6:
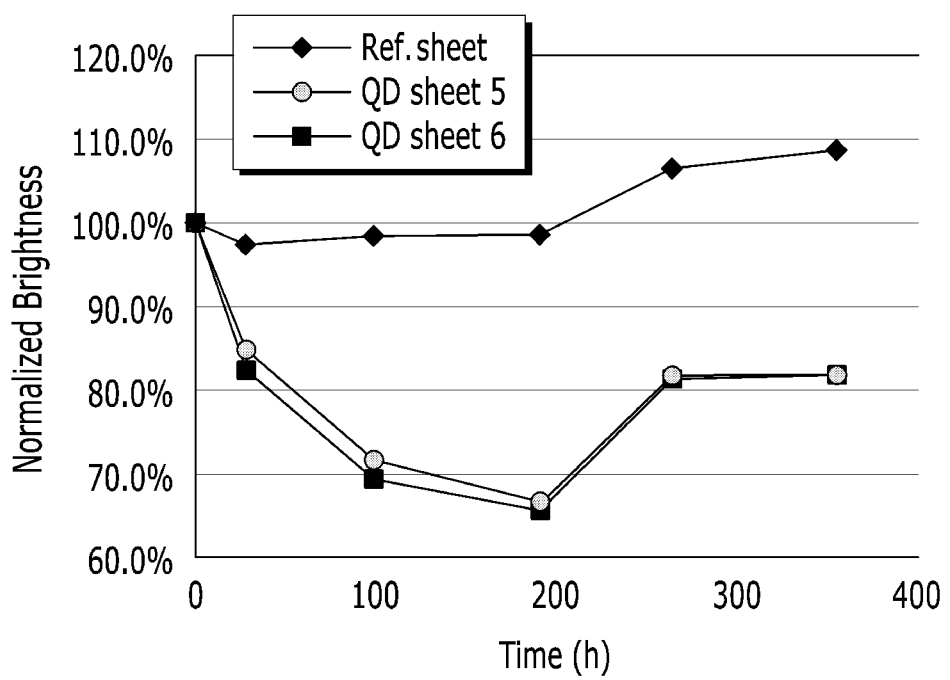
FIG. 6 is a graph of normalized brightness (percent, %) versus time (hours, h) showing results of Experimental Example 1.
Figure 7:
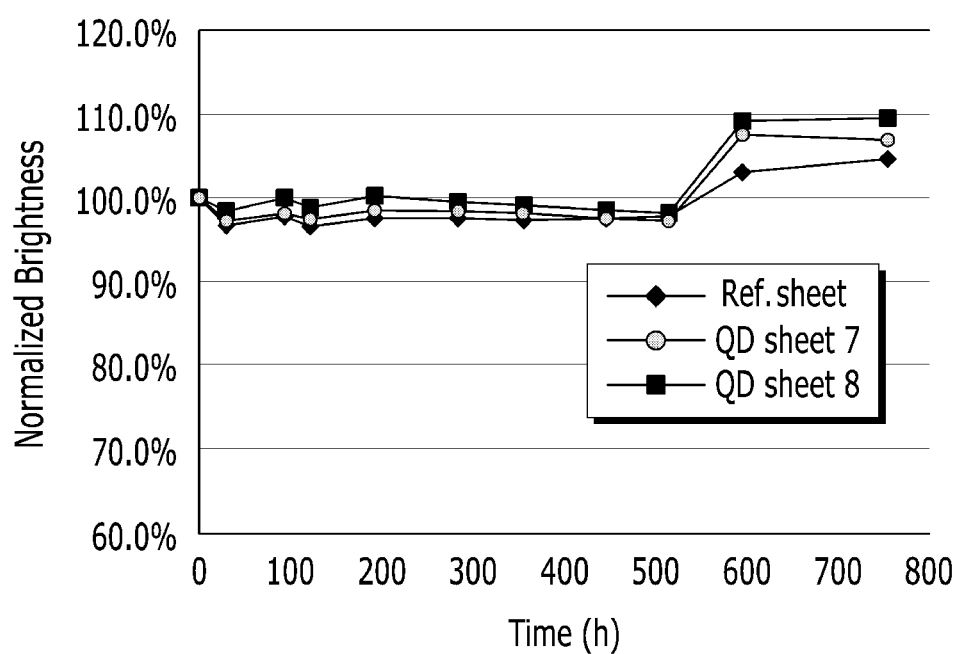
FIG. 7 is a graph of normalized brightness (percent, %) versus time (hours, h) showing results of Experimental Example 1.

The results are shown in FIG. 6, FIG. 7, and Table 2.

TABLE 2

| sample | QD sheet 5 | QD sheet 6 | QD sheet 7 | QD sheet 8 |
|---|---|---|---|---|
| composition of the first layer | 4T/TTT (60/40) | | PETSA/TTT (57/43) | |
| thickness of the first layer (um) | 94 | 92 | 71 | 102 |
| 60/95 storage time (h)/room temperature operating time (h) | 191 h/163 h | | 516 h/240 h | |
| normalized brightness (%) | 82 | 82 | 107 | 110 |
| Δ Cx | −0.003 | −0.003 | 0.001 | 0.011 |
| Δ Cy | −0.032 | −0.031 | 0.009 | 0.012 |

The results shown in FIG. 6, FIG. 7, and Table 2 show that the layered structure prepared by using PETSA as the first monomer has significantly enhanced barrier properties after a storage under a high temperature and high humidity condition.

[6] QD sheet 9 and QD sheet 10 are inserted in a TV set, which is then operated with increasing an intensity of the light source by 2 times at 60° C. Over the time of the operation, changes in the brightness are observed. The results are shown in FIG. 8 and Table 3.

TABLE 3

| sample | QD sheet 10 | QD sheet 9 |
|---|---|---|
| composition of the first layer | PE1 61.8/TTT 38.2 | PETSA 57/TTT 43 |
| Thickness of the first layer (um) | 200 | 210 |
| Operating time | 389 h | 1150 h |
| normalized brightness | 94.2% | 104.4% |

Figure 8:
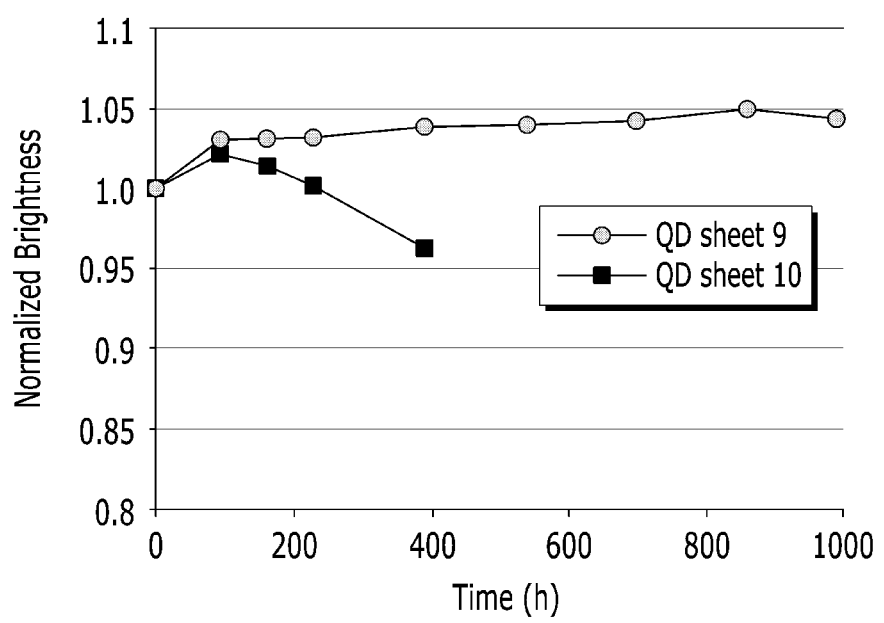
FIG. 8 is a graph of normalized brightness versus time (hours, h) showing results of Experimental Example 1.

The results shown in FIG. 8 and Table 3 show that the layered structure prepared by using PETSA as the first monomer has significantly enhanced barrier properties in comparison with the layered structure prepared by using PE1 as the first monomer.

Experimental Example 2: Evaluation of Stability at High Temperature & High Humidity PETSA and TTT are mixed at a ratio of 57/43=PETSA/TTT. Irgacure TPO (Manufacturer: BASF) is added thereto in an amount of 1 wt % based on a total weight of the mixture to form a composition for the formation of the first layer.

The composition for the formation of the first layer, thus obtained, is bar-coated on a 50 micrometer (μm)-thick release film with a wire bar and then is UV-cured by ultraviolet (UV) radiation (light intensity: 150 mW/cm²) for 10 seconds. Then, the release film is removed from the resulting product to obtain a first layer of a PETSA/TTT thiol-ene polymer.

The obtained PETSA/TTT thiol-ene polymer layer is kept at a temperature of 60° C. and a relative humidity of 95% for 280 hours and 500 hours, respectively. Then, a glass transition temperature of the PETSA/TTT thiol-ene polymer layer is measured and the results are shown in Table 4.

TABLE 4

| PETSA/TTT | Tg (° C.) |
|---|---|
| At the beginning | 55.3 |
| After 280 h | 39.5 |
| After 500 h | 14.1 |

Table 4 show that the Tg of PETSA/TTT thiol-ene polymer layer greatly decrease after 500 hours at a temperature of 60° C. and a relative humidity of 95% (hereinafter, 60/95 condition).

When the foregoing thiol-ene polymer is kept under 60/95 condition for 1,000 hours. It is confirmed by a naked eye that the first layer is melted, and thus, cannot maintain its initial shape.

From the results of Experimental Example 1 and Experimental Example 2, the QD sheet having layered structure prepared by using PETSA may show improved reliability (especially, a storage reliability under a high temperature and high humidity condition), but it shows a melting phenomenon when it is subject to high temperature and high humidity environment for a long period. Without wishing to be bound by any theory, it is believed that the ester bond is adjacent to the sulfide bond, and thus, a hydrolysis rate increases and the melting phenomenon occurs.

Experimental Example 3: Comparison of Barrier Properties Depending on a Thiol Structure II

[1] PETSA and TTT are mixed at a weight ratio of PETSA/TTT=57/43 to obtain a mixture. Irgacure TPO (Manufacturer: BASF) is added thereto in an amount of 1 wt % based on a total weight of the mixture to form a composition for the formation of the first layer.

The composition for the formation of the first layer, thus obtained, is bar-coated on a 50 micrometer (μm)-thick PET base film with a wire bar, and then, is exposed to ultraviolet (UV) radiation (light intensity: 150 mW/cm$^2$) for 10 seconds to obtain a layered structure including a first layer and a PET substrate. The same procedure is repeated to prepare the same layered structure as above.

1 g of the quantum dot composition prepared in Reference Example 2 is drop-casted on a surface of the first layer of the layered structure. Another layered structure thus prepared is disposed on the coated quantum dot composition to contact a surface of the first layer thereof with the coated quantum dot composition and UV curing is carried out for 10 seconds at a light intensity of 100 mW/cm$^2$ to prepare a quantum dot sheet having a structure shown in FIG. 2A (i.e., QD sheet 11).

[2] QD sheet 12 is prepared in the same manner as set forth in [1] except that a mixture of PETSA and 2,2'-(ethylenedioxy)diethanthiol (hereinafter, DET) at a weight ratio of 5/5 is used as the first monomer, and except that the first monomer (PETSA and DET) and the second monomer (TTT) are mixed at a weight ratio of 54/46.

[3] QD sheet 11 and QD sheet 12 are inserted to a TV set, which is then operated at a temperature of 60° C. for a predetermined time to measure the brightness and the color coordinate. The results are shown in FIG. 9 and Table 5.

TABLE 5

|  | QD sheet 11 | QD sheet 12 |
| --- | --- | --- |
| PETSA/DET (wt/wt) in the first layer | 1/0 | 5/5 |
| thickness of the first layer (um) | 94 | 108 |
| 60° C. operating time | 331 h | |
| normalized brightness | 100.0% | 48.9% |
| Δ Cx | 0.0000 | −0.0240 |
| Δ Cy | −0.0024 | −0.0956 |

Figure 9:
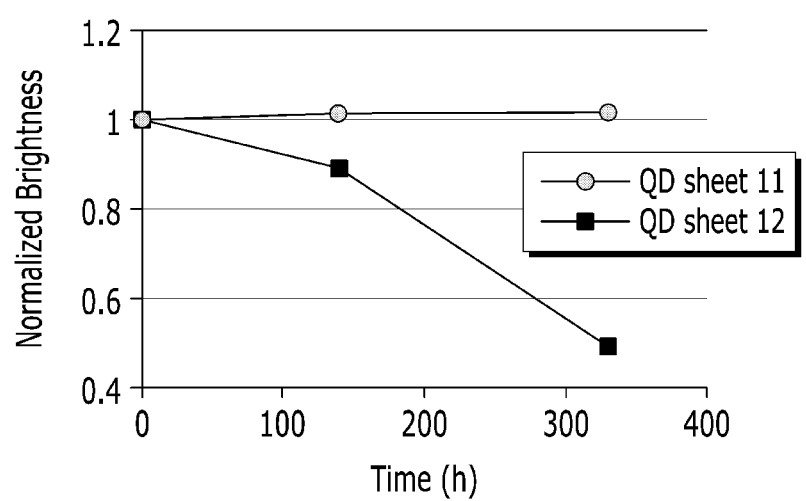
FIG. 9 is a graph of normalized brightness versus time (hours, h) showing results of Experimental Example 3.

The results shown in FIG. 9 and Table 5 show that QD sheet 12 including a thiol-ene polymer prepared by using a mixture of PETSA and DET as the first monomer in the first layer has significantly poor operation reliability in comparison with QD sheet 11 including a thiol-ene polymer prepared by using PETSA only as the first monomer in the first layer.

The above results imply that mixing PETSA with a thiol monomer without an ester moiety may bring forth a significant decrease in operation reliability.

Experimental Example 4

[1] A first monomer mixture is prepared by mixing PETSA and 4T at a mole ratio set forth in Table 6. The first monomer mixture and TTT are mixed so that the molar ratio between the thiol group and the ene group (i.e., the ratio between the number of the thiol groups and the number of the ene groups) is 0.9:1 and TPO and Irgacure (Manufacturer: BASF) is added thereto in an amount of 0.5 wt % and 0.5 wt % based on a total weight of the monomer mixture, respectively, to form a composition for the formation of the first layer.

The composition for the formation of the first layer, thus obtained, is bar-coated on a SiO$_x$ deposited PET base film (manufacturer: DNP Co. Ltd., WVTR of about 10$^{-1}$ g/cm$^2$/day and OTR of about 10$^{-1}$ cc/m$^2$/day/atm, hereinafter, "low barrier") with a wire bar, and then, is exposed to ultraviolet (UV) radiation (light intensity: 150 mW/cm$^2$) for 10 seconds to obtain a layered structure including a first layer, a second layer, and a PET substrate. The same procedure is repeated to prepare the same layered structure as above.

1 g of the quantum dot composition prepared in Reference Example 2 is drop-casted on a surface of the first layer of the layered structure. Another layered structure, thus prepared, is disposed to contact with a surface of the first layer thereof on the coated quantum dot composition and UV curing is carried out for 10 seconds at a light intensity of 100 mW/cm$^2$ to prepare a quantum dot sheet having a structure shown in FIG. 2B (i.e., QD sheet 13, QD sheet 14, and QD sheet 15).

[2] QD sheet 13, QD sheet 14, and QD sheet 15 are inserted to a TV set, which is then operated at a temperature of 60° C. for a predetermined time to measure the brightness and the color coordinate. The results are shown in FIG. 10 and Table 6.

TABLE 6

|  | QD sheet 13 | QD sheet 14 | QD sheet 15 |
| --- | --- | --- | --- |
| Mole ratio of 4T/PETSA in the first layer | 5/5 | 7/3 | 9/1 |
| Thickness (μm) | 31 | 38 | 32 |
| 60° C. operating time | | 2175 h | |
| normalized brightness | 99.1% | 99.3% | 99.6% |
| ΔCx | −0.0005 | −0.0003 | 0.0000 |
| ΔCy | −0.0036 | −0.0018 | −0.0022 |

Figure 10:
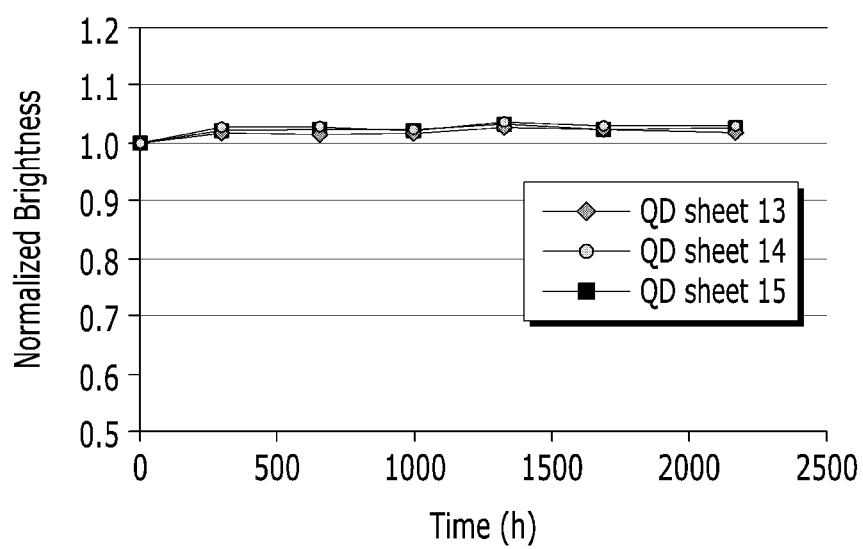
FIG. 10 is a graph of normalized brightness versus time (hours, h) showing results of Experimental Example 4.

The results shown in FIG. 10 and Table 6 confirm that QD sheet 13, QD sheet 14, and QD sheet 15 show improved barrier properties.

[3] Each of QD sheet 13, QD sheet 14, and QD sheet 15 are stored at 60° C. and a relative humidity of 95% for a predetermined time, and then, inserted into an operating TV set at room temperature for a predetermined time (aging) to measure the brightness and the color coordinate. The results are shown in FIG. 11 and Table 7.

TABLE 7

| sample | QD sheet 13 | QD sheet 14 | QD sheet 15 |
| --- | --- | --- | --- |
| 6095 storage time/room temperature operating time | | 1109 h/334 h | |
| normalized brightness | 103% | 98.4% | 95.1% |
| ΔCx | 0.0089 | 0.0066 | 0.0050 |
| ΔCy | 0.0014 | −0.0055 | −0.0102 |

Figure 11:
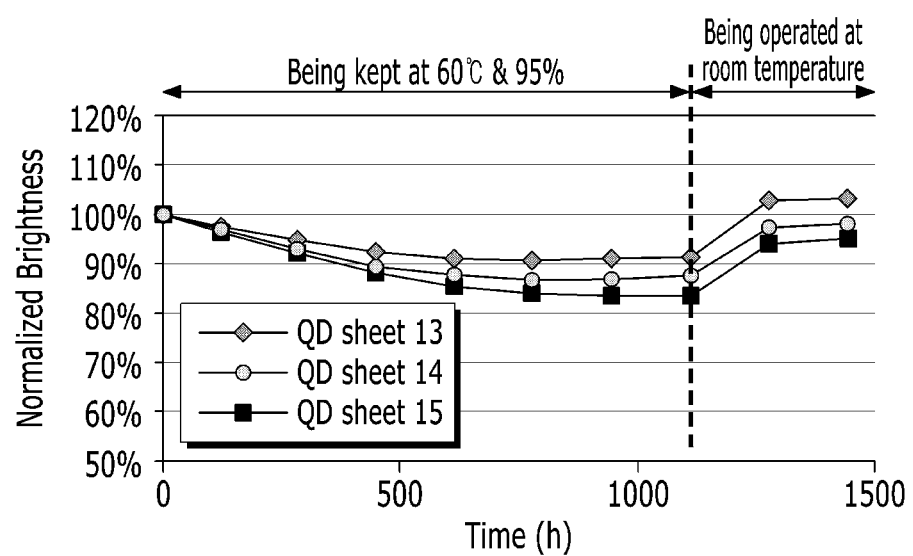
FIG. 11 is a graph of normalized brightness (percent, %) versus time (hours, h) showing results of Experimental Example 4.

The results shown in FIG. 11 and Table 7 confirm that QD sheet 13, QD sheet 14, and QD sheet 15 maintain improved barrier properties when they are kept under a high temperature and high humidity condition for long time.

[4] QD sheet A1 and QD sheet A2 are prepared in the same manner set forth in [1] except that only 4T is used for the first monomer without PETSA. QD sheet A1 and QD sheet A2 are kept at a temperature of 60° C. and a relative humidity of 95% for a predetermined time set forth Table 8.

A TV set including QD sheet A2 is operated at room temperature for a predetermined time and the brightness and the color coordinate are measured. The results are shown in Table 8.

TABLE 8

|  | QD sheet A1 | QD sheet A2 |
| --- | --- | --- |
| thickness of the first layer (μm) | 30 | 30 |
| storage time | 887 h | 636 h |
| aging time | — | 251 h |
| normalized brightness | 76% | 87% |
| ΔCx | −0.0123 | −0.0025 |
| ΔCy | −0.0367 | −0.0224 |

The results of Table 8 confirm that in case of QD sheet A1, the brightness continuously decreases to 76% of the initial brightness thereof, when it is kept under 6095 condition for 887 hours. In case of QD sheet A2, the brightness becomes 87% of the initial value thereof, when it is kept under 6095 condition for 636 hours and is operated (aging) at room temperature for 251 hours. Such results imply that a barrier coating prepared by using 4T alone has a significantly low level of the brightness retention, when it is stored under high temperature and high humidity condition.

Experimental Example 5

[1] A first monomer mixture is prepared by mixing PETSA and 4T at a mole ratio of 3/7. The first monomer mixture and the second monomer (TTT) are mixed at a weight ratio of 56/44 and Irgacure TPO (Manufacturer: BASF) is added thereto in an amount of 1 wt % based on a total weight of the mixture to form a composition for the formation of the first layer.

On the low barrier used in Experimental Example 4, a silane compound is coated to form a primer layer. The composition for the formation of the first layer, thus obtained, is bar-coated on the primer layer with a wire bar, and is then exposed to ultraviolet (UV) radiation (light intensity: 150 mW/cm$^2$) for 10 seconds to obtain a layered structure including a first layer, a primer layer, a second layer, and a PET substrate. The same procedure is repeated to prepare the same layered structure as above.

1 g of the quantum dot composition prepared in Reference Example 2 is drop-casted on a surface of the first layer of the layered structure. Another layered structure, thus prepared, is disposed on the coated quantum dot composition to contact a surface of the first layer thereof with the coated quantum dot composition, and the UV curing is carried out for 10 seconds at a light intensity of 100 mW/cm$^2$ to prepare a quantum dot sheet having a structure shown in FIG. 3 (i.e., QD sheet 16).

[2] A PET base film having a deposited SiO$_x$ on one side thereof as a barrier layer is prepared (WVTR and OTR of about 0.01 g/cm$^2$/day, hereinafter, "high barrier"). On the high barrier, a silane compound is coated to form a primer layer. 1 g of the quantum dot composition prepared in Reference Example 2 is drop-casted on a surface of the primer layer. Another high barrier with a primer layer is disposed on the coated quantum dot composition to contact a surface of the deposited SiO$_2$ with the coated quantum dot composition, and the UV curing is carried out for 10 seconds at a light intensity of 100 mW/cm$^2$ to prepare QD sheet 17.

[3] QD sheet 16 and QD sheet 17 are inserted to a TV set, which is then operated at 60° C. over a predetermined time, changes in the brightness and the color coordinate are observed. The results are shown in FIG. 12 and Table 9.

TABLE 9

|  | QD sheet 17 | QD sheet 16 |
| --- | --- | --- |
| first layer composition | — | PETSA/4T/TTT |
| 60° C. operating time | 1574 h | |
| normalized brightness | 100% | 99.5% |
| ΔCx | 0.0000 | 0.0000 |
| ΔCy | −0.0004 | −0.0014 |

Figure 12:
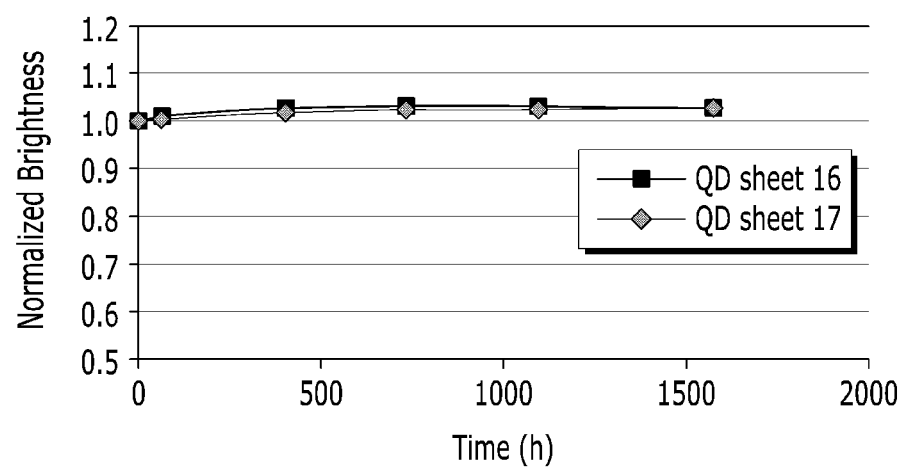
FIG. 12 is a graph of normalized brightness versus time (hours, h) showing some results of Experimental Example 5.

The results of Table 9 and FIG. 12 confirm that QD sheet 16 having an inorganic layer of about 0.1 g/cm$^2$/day of WVTR and OTR (i.e., a significantly poor barrier properties) has operation reliability that is comparable to QD sheet 17 having an inorganic layer of about 0.01 g/cm$^2$/day of WVTR and OTR (i.e., a significantly superior barrier properties). The cost for the production of QD sheet 16 is about half of the production cost of the QD sheet 17.

[5] QD sheet 16 and QD sheet 17 are kept at a temperature of 60° C. and a relative humidity of 95% for a predetermined time, and changes in the brightness and the color coordinate are observed. After the completion of the storage under the 60/95 condition, they are operated at ambient temperature, and changes in the brightness and the color coordinate are observed. The results are shown in FIG. 13 and Table 10.

TABLE 10

|  | QD sheet 17 | QD sheet 16 |
| --- | --- | --- |
| first layer composition | — | PETSA/4T/TTT |
| 6095 storage time/ room temperature operating time | 1002 h/384 h | |
| normalized brightness | 88.0% | 98.4% |
| ΔCx | −0.0001 | 0.0020 |
| ΔCy | −0.0208 | −0.0047 |

Figure 13:
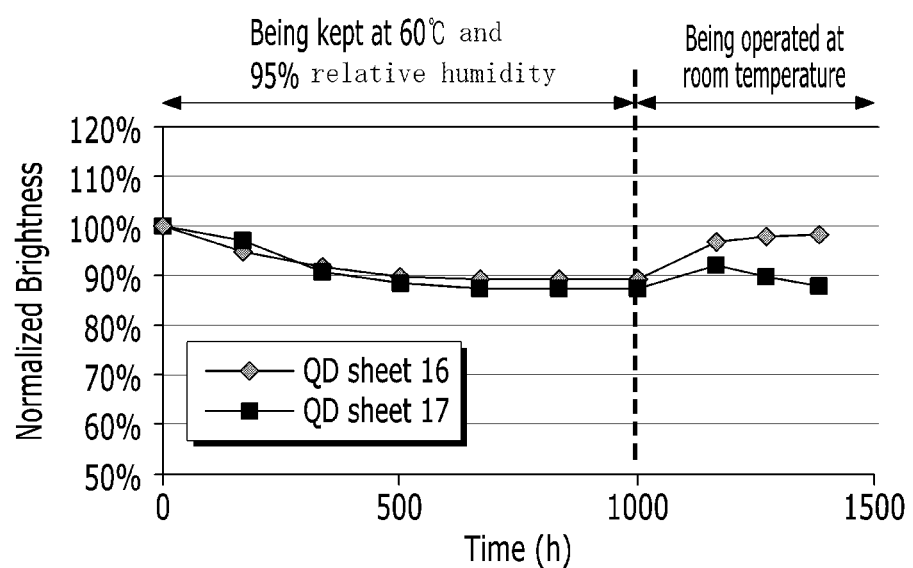
FIG. 13 is a graph of normalized brightness (percent, %) versus time (hours, h) showing results of Experimental Example 5.

The results shown in FIG. 13 and Table 10 confirm that QD sheet 16 having an inorganic layer of about 0.1 g/cm$^2$/day of WVTR and OTR (i.e., a significantly poor barrier properties) has high temperature/high humidity storage stability that is comparable to QD sheet 17 having an high quality inorganic layer of 0.01 g/cm$^2$/day of WVTR and OTR (i.e., a significantly superior barrier properties).

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:
1. A quantum dot sheet comprising:
   a photoconversion layer comprising a polymer matrix and a plurality of quantum dots dispersed in the polymer matrix; and
   a layered structure comprising a first layer comprising a polymerization product of a monomer combination comprising a first monomer having at least two thiol groups at its terminal end and a second monomer having at least two carbon-carbon unsaturated bond-containing groups at its terminal end,
   wherein the first monomer comprises a first thiol compound represented by Chemical Formula 1-1 comprising a thioglycolate moiety and a second thiol represented by Chemical Formula 1-2:

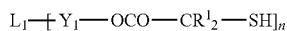

Chemical Formula 1-1 wherein in Chemical Formula 1-1,
$L_1$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group,
$Y_1$ is a single bond or a substituted or unsubstituted C1 to C4 alkylene group,
$R^1$ is same or different and each independently hydrogen or C1 to C3 alkyl group,
n is an integer of 2 to 4,
$L_1$ has a valence of at least n,

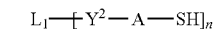

Chemical Formula 1-2 wherein in Chemical Formula 1-2,
$L_1$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group,
$Y^2$ is a single bond; —$(OCH_2CH_2)_m$— (wherein m is an integer of 1 to 10), sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), —RB— [wherein R is a C1 to C20 substituted or unsubstituted divalent linear or branched alkylene group, a C1 to C20 substituted or unsubstituted divalent linear or branched alkylene group having at least one methylene replaced with sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), or a combination thereof, or —$(OCH_2CH_2)_m$— (wherein m is an integer of 1 to 10) and B is sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), or a combination thereof], or a combination thereof,
A is a C2 to C4 divalent alkylene group,
n is an integer of 2 to 4,
$L_1$ has a valence of at least n; and
the second monomer comprises an ene compound represented by Chemical Formula 2:

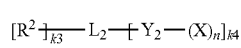

Chemical Formula 2 wherein in Chemical Formula 2,
X is —CR=$CR_2$ or —C≡CR (wherein R is each independently hydrogen or a C1 to C3 alkyl group),
$R^2$ is selected from hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted alkyl amine group (—NRR', wherein R and R' are independently hydrogen or a C1 to C30 linear or branched alkyl group provided that both of R and R' cannot be hydrogen at the same time); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted alkylene group and X is a halogen); —C(=O)OR' (wherein R' is hydrogen or a C1 to C20 linear or branched alkyl group); —CN; —C(=O)ONRR' (wherein R and R' are independently hydrogen or a C1 to C20 linear or branched alkyl group); or a combination thereof,
$L_2$ is a carbon atom, a substituted or unsubstituted C1 to C30 alkylene group, a substituted or unsubstituted C6 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group,
$Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene (—$CH_2$—) group is replaced by sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof,
n is an integer of 1 or more,
k3 is an integer of 0 or more,
k4 is an integer of 1 or more, and
the sum of n and k4 is an integer of 3 or more,
provided that n does not exceed the valence of $Y_2$, and
provided that the sum of k3 and k4 does not exceed the valence of $L_2$, and
wherein the layered structure is disposed on at least one surface of the photoconversion layer, wherein the at least one surface of the photoconversion layer faces a surface of the first layer of the layered structure.

2. The quantum dot sheet of claim 1, wherein the polymer matrix comprises a thiol-ene polymer, a poly(meth)acrylate, a urethane polymer, an epoxy polymer, a vinyl polymer, a silicone polymer, or a combination thereof.

3. The quantum dot sheet of claim 1, wherein the quantum dot comprises a Group II-VI compound, a Group III-V compound, a Group IV-VI compound, a Group IV element or compound, a Group I—III-VI compound, a Group I—II-IV-VI compound, or a combination thereof.

4. The quantum dot sheet of claim 1, wherein the quantum dot sheet has a brightness maintenance ratio of greater than or equal to about 90% when it is kept at a temperature of 60° C. and a relative humidity of 95% for 1,000 hours.

5. A backlight unit comprising a quantum dot sheet of claim 1.

6. An electronic device comprising a quantum dot sheet of claim 1.

* * * * *